United States Patent
Yamazaki

(10) Patent No.: US 6,323,070 B1
(45) Date of Patent: Nov. 27, 2001

(54) SEMICONDUCTOR DEVICE AND ITS MANUFACTURING METHOD

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/152,362

(22) Filed: Sep. 14, 1998

Related U.S. Application Data

(63) Continuation of application No. 08/805,950, filed on Feb. 24, 1997.

(30) Foreign Application Priority Data

Feb. 26, 1996 (JP) ........................................ 8-65321

(51) Int. Cl.$^7$ ............................. H01L 21/00; H01L 21/84
(52) U.S. Cl. .......................... 438/162; 438/166; 438/487
(58) Field of Search .................................. 438/166, 162, 438/308, 487

(56) References Cited

U.S. PATENT DOCUMENTS

| | | | |
|---|---|---|---|
| 5,147,826 | 9/1992 | Liu et al. | 437/233 |
| 5,275,851 | 1/1994 | Fonash et al. | 47/578 |
| 5,289,030 | * 2/1994 | Yamazaki et al. | 257/410 |
| 5,294,811 | 3/1994 | Aoyama et al. | . |
| 5,313,076 | * 5/1994 | Yamazaki et al. | 257/66 |
| 5,403,772 | * 4/1995 | Zhang et al. | 437/101 |
| 5,410,428 | * 4/1995 | Yamagata et al. | 359/350 |
| 5,426,064 | 6/1995 | Zhang et al. | 437/40 |
| 5,453,858 | * 9/1995 | Yamazaki | 359/59 |
| 5,481,121 | 1/1996 | Zhang et al. | 257/64 |
| 5,488,000 | 1/1996 | Zhang et al. | 437/21 |
| 5,492,843 | 2/1996 | Adachi et al. | 437/21 |
| 5,498,904 | * 3/1996 | Harata et al. | 257/62.3 |
| 5,501,989 | 3/1996 | Takayama et al. | 437/21 |
| 5,508,533 | 4/1996 | Takemura | 257/64 |
| 5,523,266 | * 6/1996 | Nishimura et al. | 501/54 |
| 5,529,937 | 6/1996 | Zhang et al. | 437/101 |
| 5,534,716 | 7/1996 | Takemura | 257/72 |
| 5,543,352 | 8/1996 | Ohtani et al. | 437/101 |
| 5,563,426 | * 10/1996 | Zhang et al. | 257/66 |
| 5,569,610 | 10/1996 | Zhang et al. | 437/21 |
| 5,569,936 | 10/1996 | Zhang et al. | 257/66 |
| 5,576,556 | * 11/1996 | Takemura et al. | 257/69 |
| 5,580,792 | 12/1996 | Zhang et al. | 437/10 |
| 5,585,291 | 12/1996 | Ohtani et al. | 437/40 |
| 5,589,694 | 12/1996 | Takayama et al. | 257/67 |
| 5,595,923 | 1/1997 | Zhang et al. | 437/41 |
| 5,595,944 | 1/1997 | Zhang et al. | 437/41 |
| 5,604,360 | 2/1997 | Zhang et al. | 257/72 |
| 5,605,846 | 2/1997 | Ohtani et al. | 437/21 |

(List continued on next page.)

OTHER PUBLICATIONS

Wolf, Stanley "Silicon Processing For The VLSI Era vol. 1: Process Technology", Lattice Press, 1986, pp. 200–209.*

M.J. Thompson, et al., "Silicide Formation in pd–a–Si:H Schottky Barriers", Appl. Phys. Lett. 39, pp. 274–275, 1981. Month unknown.

(List continued on next page.)

*Primary Examiner*—Michael S. Lebentritt
(74) *Attorney, Agent, or Firm*—Fish & Richardson P.C.

(57) ABSTRACT

A crystalline silicon film is formed on a substrate containing an OH group at 50–2,000 ppm and chlorine at 10–1,000 ppm at a process temperature range of 640°–980° C. by utilizing nickel. A thermal oxidation film is formed on the crystalline silicon film at a process temperature within the above range in an atmosphere containing HCl. By virtue of the action of chlorine, nickel is gettered into the thermal oxidation film. By removing the thermal oxidation film, a crystallline silicon film is obtained which has superior crystallinity and a low nickel concentration.

19 Claims, 8 Drawing Sheets

U.S. PATENT DOCUMENTS

| | | | |
|---|---|---|---|
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 437/101 |
| 5,614,426 | 3/1997 | Funada et al. | 437/40 |
| 5,614,733 | 3/1997 | Zhang et al. | 257/66 |
| 5,616,506 | 4/1997 | Takemura | 438/150 |
| 5,619,044 * | 4/1997 | Makita et al. | 257/64 |
| 5,620,910 | 4/1997 | Teramoto | 438/151 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 437/228 |
| 5,643,826 | 7/1997 | Ohtani et al. | 437/88 |
| 5,646,424 | 7/1997 | Zhang et al. | 257/66 |
| 5,648,277 * | 7/1997 | Zhang et al. | 437/21 |
| 5,654,203 | 8/1997 | Ohtani et al. | 438/97 |
| 5,656,825 | 8/1997 | Kusumoto et al. | 257/66 |
| 5,663,077 | 9/1997 | Adachi et al. | 438/151 |
| 5,700,333 | 12/1997 | Yamazaki et al. | 136/258 |
| 5,731,613 * | 3/1998 | Yamazaki et al. | 257/350 |
| 5,739,549 * | 4/1998 | Takemura et al. | 257/59 |
| 5,753,542 * | 5/1998 | Yamazaki et al. | 438/162 |
| 5,843,225 * | 12/1998 | Takayama et al. | 117/8 |
| 5,858,823 * | 1/1999 | Yamazaki et al. | 438/166 |
| 5,985,740 | 11/1999 | Yamazaki et al. . | |

OTHER PUBLICATIONS

R.J. Nemanich, et al., "Initial Phase Formation at the Interface of Ni, Pd, or Pt and Si", Mat. Res. Soc. Symp. Proc, 1984. Month unknown.

R.J. Nemanich, et al., "Structure and Growth of the Interface of Pd on a–Si:H", Physical Review B 23, pp. 6828–6831, 1981. Month unknown.

* cited by examiner

SEMICONDUCTOR DEVICE AND ITS MANUFACTURING METHOD

This is a continuation of U.S. application Ser. No. 08/805,950, filed Feb. 24, 1997 (pending).

BACKGROUND OF THE INVENTION

1. Field of the Invention

The present invention relates to a semiconductor device as typified by a thin-film transistor formed on a substrate, as well as to a manufacturing method thereof.

2. Description of Related Art

The thin-film transistor using a silicon film is known. In this technique, a thin-film transistor is formed by using a silicon film formed on a glass or quartz substrate.

The reason for using a glass or quartz substrate is that thin-film transistors are used for an active matrix liquid crystal display device. Conventionally, thin-film transistors are formed by using an amorphous silicon film. However, to provide higher performance, it is now attempted to form thin-film transistors by using a silicon film having crystallinity (called a crystalline silicon film).

A thin-film transistor using a crystalline silicon film can operate faster than that using an amorphous silicon film by two or more orders. Therefore, by employing thin-film transistors using a crystalline silicon film, peripheral drivers circuits of an active matrix liquid crystal display device, which are conventionally external IC circuits, can be formed on a glass or quartz substrate with an active matrix circuit.

The above configuration is very advantageous in terms of miniaturization of the entire device and simplification of a manufacturing process as well as reduction in manufacturing cost.

A crystalline silicon film is obtained by forming an amorphous silicon film through plasma CVD or low-pressure thermal CVD, and then crystallizing it through a heat treatment or irradiation with laser light.

However, with the heat treatment, it is currently difficult to obtain a desired level of crystallinity over a wide area; for example, crystallization is uneven.

On the other hand, although the method using the laser light irradiation can provide superior crystallinity partially, it is difficult for even such a technique to provide good annealing effects over a wide area. In particular, irradiation with laser light under such conditions as to provide a high degree of crystallinity tends to be unstable.

A technique described in Japanese Unexamined Patent Publication No. Hei. 6-232059 is known as a method for solving the above problems. In this technique, a metal element (for instance, nickel) for accelerating crystallization of silicon is introducing an amorphous silicon film, thereby providing a crystalline silicon film by a heat treatment of a lower temperature than in conventional techniques.

Studies of the present inventors have proved that a crystalline silicon film produced by this technique has, over a wide area, sufficiently high crystallinity to be suitable for practical use.

However, this technique has a problem that delicate control is needed for the introduction amount of a metal element because it remains in a resulting film. Accordingly, it has been found that this technique is problematic in reproducibility and electrical stability of a device produced.

In addition, there is a problem that the characteristics of a semiconductor device produced considerably varies with time, which is an influence of a residual metal element. The residual metal element also causes a problem that the off-current of a thin-film transistor fabricated by using the above-mentioned film is large.

That is, although the metal element for accelerating crystallization of silicon is very useful to form a crystalline silicon film, it is associated with negative factors that cause various problems after formation of a crystalline silicon film.

SUMMARY OF THE INVENTION

An object of the present invention is to provide a technique for reducing the concentration of a metal element for accelerating crystallization of silicon in a crystalline silicon film formed by utilizing the metal element. Another object of the invention is to provide a thin film semiconductor device having superior electrical characteristics by utilizing the film formed in the present invention.

According to one aspect of the invention, there is provided a manufacturing method of a semiconductor device, comprising the step of forming a crystalline silicon film on a substrate by using a metal element for accelerating crystallization of silicon, wherein during the step, a maximum process temperature (the highest temperature during the process) is higher than 650° C. and lower than 1,000° C., and a process time not shorter than one hour; the substrate contains OH group at 50–2,000 ppm and chlorine at 10–1,000 ppm; and the substrate has a strain point of 650°–1,000° C.

According to another aspect of the invention, there is provided a manufacturing method of a semiconductor device, comprising the step of forming a crystalline silicon film on a substrate by using a metal element for accelerating crystallization of silicon, wherein during the step, a maximum process temperature be higher than 700° C. and lower than 980° C. and a process time be not shorter than 30 minutes.

According to another aspect of the invention, there is provided a manufacturing method of a semiconductor device, comprising the steps of forming a crystalline silicon film on a substrate by using a metal element for accelerating crystallization of silicon; and removing the metal element from the crystalline silicon film by forming a thermal oxidation film containing a halogen element, wherein each of the two steps has a maximum process temperature that is higher than 650° C. and lower than 1,000° C., and a process time not shorter than one hour; the substrate contains OH group at 50–2,000 ppm and chlorine at 10–1,000 ppm; and the substrate has a strain point of 650°–1,000° C.

According to a further aspect of the invention, there is provided a semiconductor device using a substrate, wherein the substrate contains OH group at 50–2,000 ppm and chlorine at 10–1,000 ppm; and the substrate has a strain point of 650°–1,000° C.

According to another aspect of the invention, there is provided a semiconductor device comprising a silicon thin film formed on a substrate, wherein the substrate contains OH group at 50–2,000 ppm and chlorine at 10–1,000 ppm; the substrate has a strain point of 650°–1,000° C.; the silicon thin film contains a metal element that accelerates crystallization of silicon at a concentration of $1 \times 10^{16}$ to $5 \times 10^{19}$ cm$^{-3}$, the metal element existing at a high concentration in the vicinity of a interface of the silicon thin film.

Where a metal element for accelerating crystallization of silicon is used, the concentration of the residual metal element in a resulting crystalline silicon film is within the above range. If a crystalline silicon film contains a metal element at a higher concentration than the above range, it is too much influenced by the metal element to exhibit semiconductor characteristics. Further, the reliability of a semiconductor device is extremely lowered.

According to still another aspect of the invention, there is provided a semiconductor device comprising a silicon thin film formed on a substrate, wherein the substrate contains OH group at 50–2,000 ppm and chlorine at 10–1,000 ppm; the substrate has a strain point of 650°–1,000° C.; the silicon thin film contains a metal element that accelerates crystallization of silicon at $1 \times 10^{16}$ to $5 \times 10^{19}$ cm$^{-3}$, and a halogen element at not less than $1 \times 10^{16}$ cm$^{-3}$.

Where a thermal oxidation film is formed by a heat treatment in an atmosphere containing a halogen element, the halogen element enters into a crystalline silicon film during the formation of the thermal oxidation film. As a result, the halogen element is contained in the crystalline silicon film at not less than $1 \times 10^{16}$ cm$^{-3}$. It is preferred that the upper limit of the concentration of the halogen element be about $5 \times 10^{20}$ cm$^{-3}$.

According to a further aspect of the invention, there is provided a semiconductor device comprising a silicon thin film formed on a substrate, wherein the substrate has a strain point of 650°–1,000° C.; and the silicon thin film contains a metal element that accelerates crystallization of silicon at $1 \times 10^{16}$ to $5 \times 10^{19}$ cm$^{-3}$, and a halogen element at not less than $1 \times 10^{16}$ cm$^{-3}$.

In the invention, the metal element may be one or a plurality of elements selected from Fe, Co, Ni, Ru, Rh, Pd, Os, Ir, Pt, Cu, and Au.

The oxidizing atmosphere containing a halogen element may be an $O_2$ atmosphere or an $O_2$-containing atmosphere to which one or a plurality of gases selected from HCl, HF, HBr, $CL_2$, $F_2$, $Br_2$, and $NF_3$ are added.

In this specification, the impurity concentration is defined as the minimum of measurement values of SIMS (secondary ion mass spectrometry), OH group is measured by IR-Spectrometer, and Chlorine is measured by Radioactive Analysis.

DETAILED DESCRIPTION OF THE PREFERRED EMBODIMENTS

Figure 1A:
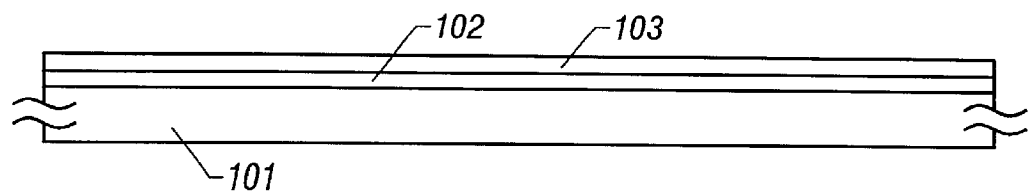
FIGS. 1A–1E show a manufacturing process of a crystalline silicon film according to a first embodiment of the present invention.

A manufacturing method of the present invention is summarized below.

First, an amorphous silicon film is formed on a substrate having given properties as disclosed in this specification.

Next, a crystalline silicon film is obtained by crystallizing the amorphous silicon film by action of a metal element, as typified by nickel, for accelerating crystallization of silicon. This is done by a heat treatment with the aid of laser light irradiation.

It is effective that the heat treatment for crystallization be performed at 650°–1,000° C. Although the crystallization proceeds even below the above temperature range, it is preferred, to provide superior crystallinity, that the crystallization be performed in the above temperature range.

In particular, where a crystalline silicon film is obtained by utilizing lateral growth, a crystalline silicon film (or a crystallized region) of very high practicality can be obtained by performing a heat treatment in the above temperature range.

A heat treatment at a temperature higher than the above range is not preferable. That is, because of high heat resistance required for jigs of a manufacturing apparatus, a substrate which is expensive and inconvenient to handle needs to be used and it is disadvantageous for increase in substrate size.

The crystalline silicon film obtained by the above heat treatment contains the metal element at a considerable concentration.

Then, a heat treatment is performed in an oxidizing atmosphere containing HCl, to form a thermal oxidation film on the surface of the crystalline silicon film. In this heat treatment, the metal element moves to the thermal oxidation film to be contained therein at a high concentration. As a result, the concentration of the metal element in the crystal silicon film decreases.

The temperature of the heat treatment is set within the range of 650°–1,000° C. If the temperature is lower than the above range, a thermal oxidation is not formed properly, so that the metal element is not removed efficiently from the crystalline silicon film.

If the temperature is higher than the above range, the film quality of a thermal oxidation film likely varies. However, it is necessary to use a higher heat-resist substrate which is more expensive and inconvenient to handle. Further, heavier burdens are imposed on the apparatus side. Thus, such a high temperature is not preferable.

After the heat treatment, the resulting thermal oxidation film is removed to leave a crystalline silicon film that is superior in crystallinity and low in nickel concentration.

The substrate should be such that the OH group concentration is 50–2,000 ppm, the chlorine concentration is 10–1,000 ppm, and the strain point is 650°–1,000° C. It is even preferable that the OH group concentration be 300–700 ppm, and that the chlorine concentration be 50–150 ppm.

By setting the OH group concentration in the above range, the substrate is given a certain level of flexibility, which is effective in preventing it from being damaged during its transfer or handling.

By setting the chlorine concentration in the above range, the substrate side is given a metal element gettering function.

By setting the strain point at 650°–950° C., preferably at not less than 800° C., the warp and deformation of the substrate can be rendered a level that does not cause any problem.

Embodiment 1

This embodiment is directed to a method for forming a crystalline silicon film on a substrate by utilizing a nickel element.

This embodiment uses a substrate produced from $SiCl_4$ which substrate contains OH group at 300–700 ppm and chlorine at 50–150 ppm. This substrate can be used in a temperature range of 600°–800° C.

A manufacturing process of this embodiment is hereinafter described with reference to FIGS. 1A–1E.

First, a 3,000-Å-thick silicon oxide film 102 as an undercoat film is formed on a substrate 101 as mentioned above by sputtering. The silicon oxide film 102 has a function of suppressing diffusion of impurities from the substrate 101 in later steps (a large amount of impurities are contained in the substrate 101 by the standard of the semiconductor manufacture). To maximize the function of suppressing the impurity diffusion, it is the best to use sputtering for formation of the silicon oxide film 102, because the resulting silicon oxide film 102 is fine and solid.

It is important that the undercoat film 102 have as high a hardness as possible. This conclusion is derived from the fact that a finally obtained thin-film transistor is judged higher in reliability in a durability test when the undercoat film 102 is harder (i.e., has a smaller etching rate). This is considered due to an effect of interrupting impurities coming from the glass substrate 101 during manufacture of a thin-film transistor.

Hardening the undercoat film 102 has another effect of suppressing formation of a disarrangement layer between the undercoat film 102 and a silicon film.

The disarrangement layer contains many amorphous components and low-grade crystal components, and is a large factor of destabilizing the operation of a finally obtained thin-film transistor. Therefore, it is important to reduce the thickness of the disarrangement layer by improving the film quality of the undercoat film 102. Specifically, it is important to control the film quality of the undercoat film 102 so that the thickness of the disarrangement layer becomes 2–50 Å.

It is effective to add a very small amount of halogen element as typified by chlorine to the undercoat film 102. The halogen element can getter a metal element for accelerating crystallization of silicon existing in a semiconductor layer in a later step.

It is effective to perform hydrogen plasma processing after the formation of the undercoat film 102. Plasma processing in a mixed atmosphere of oxygen and hydrogen is also effective. This provides an effect of removing carbon components absorbed into the surface of the undercoat film 102, thereby improving the characteristics of a interface with a semiconductor film to be formed thereon. Further, by removing carbon components, the formation of a disarrangement layer as mentioned above can be suppressed.

If the substrate 101 is superior in flatness and its surface can be cleaned, it is not necessary to form the undercoat film 102. However, even in this case, to perform plasma processing is effective in suppressing formation of a disarrangement layer,.

Next, a 1,600-Å-thick amorphous silicon film 103 to be later crystallized is formed through low-pressure thermal CVD. The use of low-pressure thermal CVD is due to the fact that a resulting crystalline silicon film is superior in film quality, i.e., it is fine. Instead of low-pressure thermal CVD, plasma CVD may be used.

It is desired that the amorphous silicon film 103 contain oxygen at $5 \times 10^{17}$ to $2 \times 10^{19}$ cm$^{-3}$, because oxygen plays an important role in a later step for gettering a metal element (for accelerating crystallization of silicon).

Care should be taken so that the oxygen concentration does not exceed the above range, because the crystallization of the amorphous silicon film 103 may be impaired.

The concentrations of other elements such as nitrogen and carbon should be as low as possible, specifically less than $2 \times 10^{19}$ cm$^{-3}$.

Where the amorphous silicon film 103 is to be crystallized only by means of heating, the thickness of the starting film (i.e., amorphous silicon film 103) is set at 800–5,000 Å, preferably 1,500–3,000 Å.

If the amorphous silicon film 103 is thicker than the above range, the film formation time becomes unduly long, which is not economical in terms of production cost. On the other hand, if it is thinner than the above range, the crystallization becomes uneven or the reproducibility of the process becomes low.

Thus, the state of FIG. 1A is obtained.

Then, to crystallize the amorphous silicon film 103, a nickel element is introduced. In this embodiment, nickel is introduced to the surface of the amorphous silicon film 103 by applying a nickel acetate salt solution containing nickel at 10 ppm (in weight).

As for the method for introducing nickel, instead of using a solution as in the above case, sputtering or CVD, or even plasma processing or an absorption method may be used.

The method of using a solution is advantageous because it is simple and convenient and the metal element concentration can easily be adjusted.

Figure 1B:
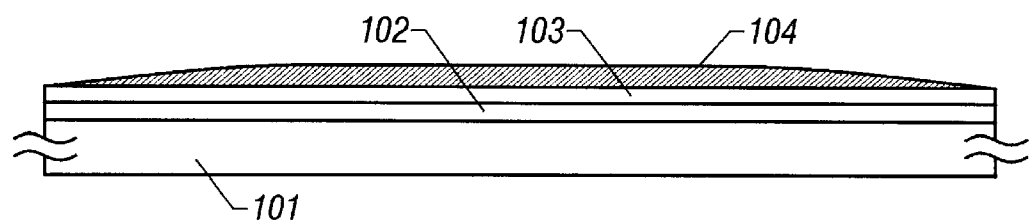

By applying the nickel acetate salt solution, a liquid film 104 of a nickel acetate salt is formed as shown in FIG. 1B. In this state, an excessive solution is blown off with a spin coater (not shown). As a result, a state is established in which nickel is held adjacent to the surface of the amorphous silicon film 103.

Taking account of a phenomenon that impurities remain in a later heating step, it is effective to use nickel sulphate rather than the nickel acetate solution. This is because the nickel acetate solution contains carbon, carbides will possibly be caused and remain in a film in a later heating step.

The nickel introduction amount can be controlled by adjusting the nickel density of the solution. It can also be controlled by coating conditions of the spin coater or the solution holding time.

Figure 1C:
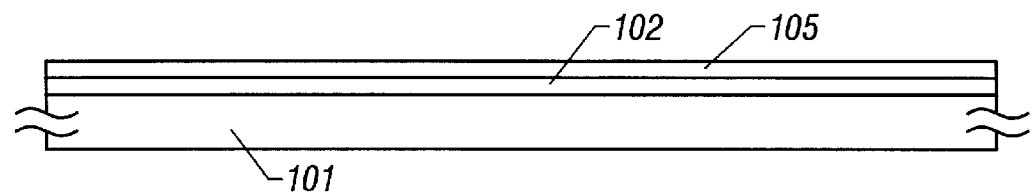

In the state of FIG. 1C, a heat treatment is performed at 800° C. for 4 hours in a reducing atmosphere (in this embodiment, a nitrogen atmosphere containing hydrogen at 3%), to crystallize the amorphous silicon film 103. Thus, a crystalline silicon film 105 is obtained.

The use of a reducing atmosphere in the crystallization step by a heat treatment prevents from forming oxides in this step, specifically, to suppress a phenomenon that nickel and oxygen react with each other to form $NiO_x$ on the surface or in the film.

Oxygen greatly contributes to removal of nickel from the silicon film through gettering. However, it has become apparent that combination of oxygen and nickel in the crystallization step obstructs the crystallization. It is therefore important to minimize the formation of oxides in the crystallization step by heating.

In the heat treatment for crystallization, it is necessary that the oxygen concentration in the atmosphere is set on the ppm order, preferably less than 1 ppm.

Instead of nitrogen, an inert gas such as argon may be used as the gas that occupies most of the atmosphere in which the heat treatment for crystallization is performed.

It is preferred that the lower limit temperature of the heat treatment for crystallization be not lower than 450° C. in view of its effects and reproducibility. It is preferred that the upper limit temperature be not lower than the strain point of the substrate 101.

If a more refractory substrate is used, the heating temperature can be increased to about 1,050° C. In this case, a crystalline silicon film having a higher crystallinity can be obtained. However, the use of such a more refractory substrate is disadvantageous in terms of production cost and yield, because it likely chips off or breaks and is expensive.

After the crystalline silicon film 105 is obtained as shown in FIG. 1C, a heat treatment is again performed in an oxidizing atmosphere containing a halogen element. In this embodiment, the heat treatment is performed at 850° C. in an nitrogen atmosphere containing oxygen at 50 volume %.

It is preferred that HCl be mixed at 0.5–10 volume % with respect to oxygen (in this embodiment, 5 volume %). If the HCl density exceeds the above range, it does the film surface is roughened to have asperities that are approximately on the same level as the film thickness. The HCl density lower than the above range is not preferable because in such a case the effect of taking nickel into an oxide film is lowered.

Figure 1D:
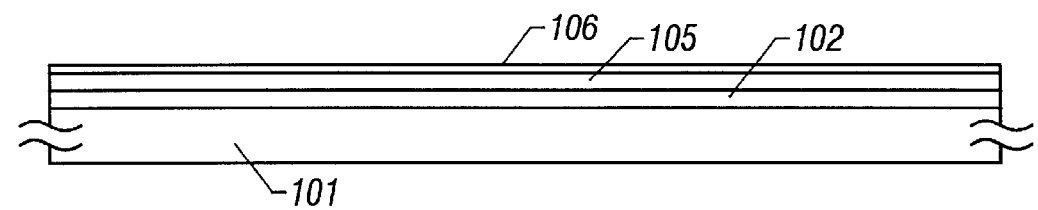

In this heat treatment, a thermal oxidation film 106 is formed at a thickness of 200 Å (see FIG. 1D).

The above heat treatment is intended to remove nickel (or some other metal element for accelerating crystallization of silicon), which has intentionally been introduced for crystallization at the initial stage, from the crystalline silicon film 105. It is preferred that this heat treatment for thermal oxidation is performed at a higher temperature than the heat treatment performed for the crystallization in order to enhance the nickel gettering effect.

The upper limit temperature of the heat treatment for the thermal oxidation is restricted by the strain point of the substrate 101. Care should be taken so that the heat treatment temperature does not exceed the strain point of the substrate 101, because if it does the substrate 101 is deformed.

As a result of the formation of the 200-Å-thick thermal oxidation film, the thickness of the crystalline silicon film, which was originally 1,600 Å, decreases to about 1,500 Å.

If the heating temperature is set high, the time for forming the desired thermal oxidation film 106 is shortened. Because of he shortened processing time, that the effect of gettering nickel from the silicon film 105 into the thermal oxidation film 106 becomes insufficient. To solve this problem, it is effective to reduce the oxygen density in the atmosphere, thereby to lower the rate of forming the thermal oxidation film 106.

In this step, nickel is gettered from the silicon film 105 due to the action of the halogen element. In this embodiment, due to the action of chlorine, nickel is gettered into the native oxide film 106 bein g formed.

Oxygen existing in the crystalline silicon film 105 plays an important role in the gettering. That is, the nickel gettering effect proceeds efficiently such that the gettering action of chlorine is exerted on nickel oxide that is formed by combination of oxygen and nickel.

As described above, if the concentration of oxygen is too high, it impairs the crystallization of the amorphous silicon film 103 in the crystallization step of FIG. 1C. On the other hand, oxygen plays an important role in the nickel gettering step. Therefore, the control of oxygen concentration in the amorphous silicon film 103 as the starting film is important.

This embodiment is directed to the case where Cl is used as the halogen element and it is introduced with the form of HCl. Other than the HCl gas, one or a plurality of gases selected from HF, HBr, $Cl_2$, $F_2$, $Br_2$ and $NF_3$ may be used. In general, a hydrogen halide may be used.

The volume density of these gases in the atmosphere is set as follows: HF: 0.25–5%; HBr: 1–15%; $Cl_2$: 0.25–5%; $F_2$: 0.125–2.5%; $Br_2$: 0.5–10%; and $NF_3$: 0.1–5%. If the density is lower than the above range, no substantial effect is obtained. If it is higher than the above range, the surface of the silicon film is roughened.

As a result of this step, the nickel concentration can be reduced to 1/10 of the initial value in the best case. This means that the nickel concentration can be reduced to 1/10 of the case where no gettering by a halogen element is effected. This similarly applies to the cases of using other metal elements.

In this step, due to the gettering of nickel into the oxide film 106 formed, the nickel concentration in the oxide film 106 is naturally higher than in the other portions.

In particular, it is observed a tendency that the nickel concentration is high at the interface between the silicon film 105 and the oxide film 106. This is considered due to the fact that the gettering is mainly effected in a region of the oxide film 106 close to the interface with the silicon film 105. The reason why the gettering is mainly effected in the region close to the interface is considered the existence of strain and defects there.

It is also observed a tendency that the nickel concentration is high at the interface between the undercoat film 102 and the silicon film 105 and its vicinity. Further, nickel is gettered into the substrate 101, because the substrate 101 also contains chlorine.

After the thermal oxidation film 106 is formed as shown in FIG. 1D, the thermal oxidation film 106 containing nickel at a high concentration is removed by wet etching using a buffered hydrofluoric acid (or some other hydrofluoric acid type etchant) or dry etching.

Figure 1E:
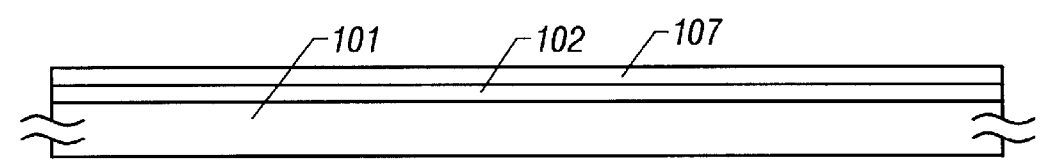

Thus, a crystalline silicon film 107 with a reduced nickel concentration is obtained as shown in FIG. 1E.

Since nickel is contained at a relatively high concentration in a region of the crystalline silicon film 107 close to its upper surface, it is effective to allow the etching of the oxide film 106 to continue until the upper surface of the crystalline silicon film 107 is somewhat etched (overetching).

Embodiment 2

This embodiment is directed to a case where after a crystalline silicon film is obtained by the heat treatment in the first embodiment (see FIG. 1C), laser light irradiation is performed to improve its crystallinity.

When the temperature of the heat treatment for crystallization is low or the processing time is short, that is, when the heating temperature or the heating time is restricted for a certain reason relating to the manufacturing process, a necessary level of crystallinity may not be attained. In such a case, a necessary, high level of crystallinity can be attained by further performing annealing by laser light irradiation.

In this laser light irradiation after the heat treatment, the allowable ranges of the laser irradiation conditions are wider than in the case of crystallizing an amorphous silicon film only by laser light irradiation. Further, the reproducibility of the laser light irradiation step is high.

The laser light irradiation may be performed after the step of FIG. 1C. In this embodiment, it is important that the thickness of the amorphous silicon film 103 as the starting film be 200–2,000 Å. This is because the annealing effects by the laser light irradiation are more remarkable when the amorphous silicon film 103 is thinner.

It is preferred that laser light emitted from an ultraviolet excimer laser is used. Specifically, it is preferred that a KrF excimer laser (wavelength: 248 nm) or an XeCl excimer laser (wavelength: 308 nm) are used.

Embodiment 3

This embodiment is directed to a case where an infrared lamp is used instead of the laser that is used in the second embodiment. Where infrared light is used, a silicon film can be heated mainly without heating the substrate much. Therefore, an effective heat treatment can be performed without imparting thermal damage to the substrate.

Embodiment 4

This embodiment is directed to a case where Cu is used as the metal element for accelerating crystallization of silicon in the first embodiment. In this case, Cu may be introduced by using a cupric acetate $(Cu(CH_3COO)_2)$ solution or a cupric chloride $(CuCl_2.2H_2O)$ solution.

Embodiment 5

This embodiment is directed to a case where crystal growth mode is different from that described in the first embodiment. More specifically, in this embodiment, crystal growth parallel with a substrate, called lateral growth, is effected by utilizing a metal element for accelerating crystallization of silicon.

FIGS. 2A–2E show a manufacturing process according to this embodiment. First, a 3,000-Å-thick silicon oxynitride film as an undercoat film 202 is formed on a substrate 201 which is the same as used in the first embodiment. If the substrate 201 is superior in flatness and its surface can be cleaned, the undercoat film 202 need not always be formed.

Next, a 2,000-Å-thick amorphous silicon film 203 as a starting film of a crystalline silicon film is formed by low-pressure thermal CVD. Instead of low-pressure thermal CVD, plasma CVD may be performed.

Next, a 1,500-Å-thick silicon oxide film (not shown) is formed and then patterned into a mask 204 having an opening 205. The amorphous silicon film 203 is exposed in the opening 205 (see FIG. 2A).

The opening assumes a long and narrow rectangle that is long in the direction perpendicular to the paper surface of FIGS. 2A–2E. It is proper that the width of the opening 205 be more than 20 μm. The length in the longitudinal direction may be determined as desired.

In this state, a nickel acetate solution containing nickel at 10 ppm (in weight) which is described in the first embodiment is applied. An excessive solution is removed by performing spin drying with a spinner (not shown).

Figure 2A:
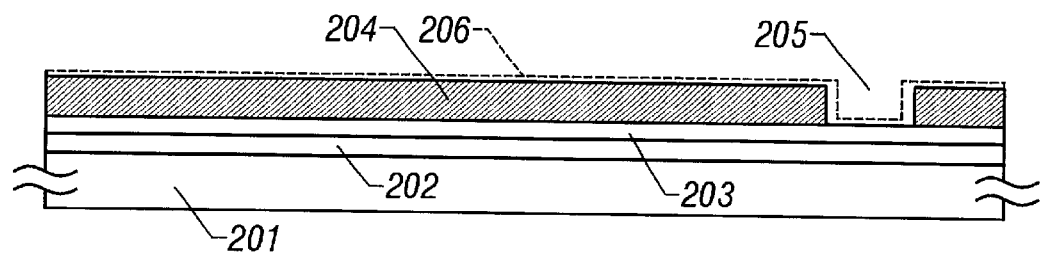
FIGS. 2A–2E show a manufacturing process of a crystalline silicon film according to a fifth embodiment of the invention.
Figure 2B:
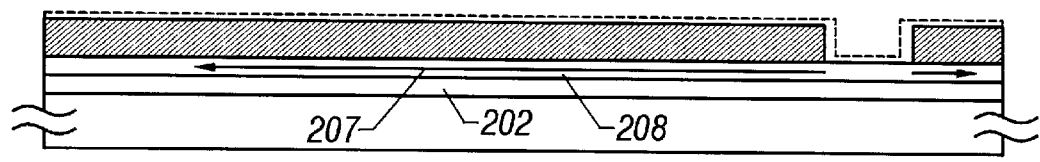

Thus, a state is established in which nickel is held adjacent to the exposed surface of the amorphous silicon film 203 as indicated by broken line 206 in FIG. 2A.

Subsequently, a heat treatment is performed at 800° C. for 4 hours in a nitrogen atmosphere containing hydrogen at 3% in which the oxygen density is minimized. In this step, crystal growth proceeds parallel with the substrate 201 as indicated by arrow 207 in FIG. 2B from the region under the opening 205 where nickel has been introduced toward the peripheries. This crystal growth parallel with the substrate 201 is called lateral growth.

Under the conditions of this embodiment, the lateral growth is allowed to proceed over more than 100 μm. Thus, a silicon film 208 having lateral growth regions is obtained (see FIG. 2B).

Figure 2C:
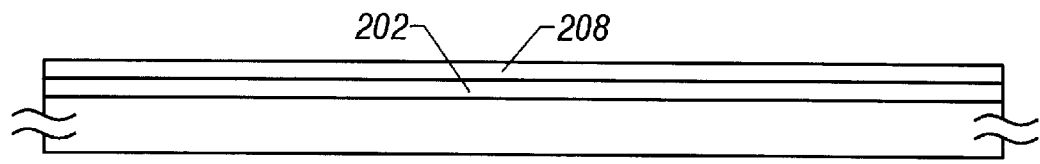

Then, the silicon oxide film mask 204 which was used for selective introduction of nickel is removed (see FIG. 2C).

In this state, a heat treatment is performed at 850° C. in a nitrogen atmosphere containing oxygen at 50% and HCl at 3% with respect to oxygen. As a result, an oxide film 209 containing nickel at a high concentration is formed. Further, the nickel concentration in the silicon film 208 can be made relatively low.

As a result of this step, the thermal oxidation film 209 is formed at a thickness of 200 Å, which contains, at a high concentration, nickel that has been gettered by the action of chlorine. As a result of the formation of the thermal oxidation film 209, the thickness of the crystalline silicon film 208 is decreased to about 1,900 Å (see FIG. 2D).

Figure 2D:
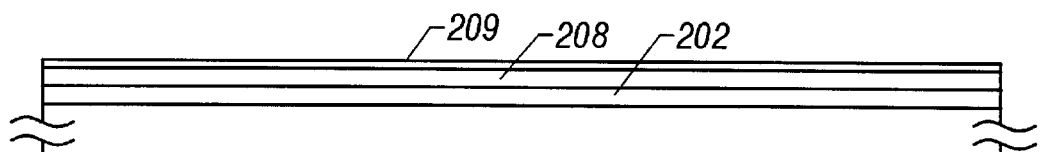

Upon the completion of the step of FIG. 2D, the thermal oxidation film 209 containing nickel at a high concentration is removed (not shown).

In this state, the crystalline silicon film 208 has a nickel concentration profile in which the concentration increases toward the surface. Therefore, it is effective to remove a region where nickel exists at a high concentration by etching somewhat the upper surface of the crystalline silicon film 208. In this manner, a crystalline silicon film with a reduced nickel concentration can be obtained.

Figure 2E:
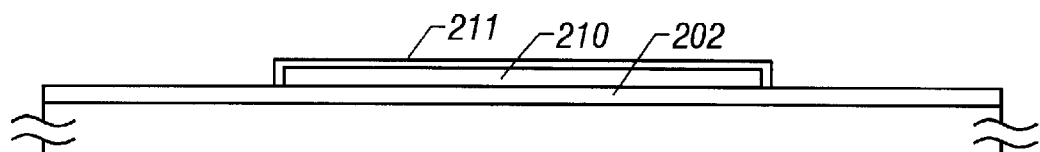

Next, the crystalline silicon film 208 is patterned into a pattern 210 consisting of a lateral growth region (see FIG. 2E).

It is important that the patterning is so performed that the pattern 210 does not include any vertical growth region, amorphous region, or leading portion of the lateral growth. This is because the nickel concentration is relatively high in a vertical growth region where the crystal grows perpendicular to the substrate, and a leading portion of the lateral growth, and an amorphous region exhibits poor electrical characteristics.

As shown in FIG. 2E, the pattern 210 which consists of only a lateral growth region has a lower residual nickel concentration than even a crystalline silicon film obtained according to the first embodiment. That is, because the concentration of a metal element in a lateral growth region is low. Specifically, the nickel concentration in the pattern 210 consisting of a lateral growth region can easily be made less than the order of $10^{17}$ $cm^{-3}$.

A thin-film transistor formed by using a lateral growth region exhibits a larger mobility than that formed by using a vertical growth region as in the case of the first embodiment (in the first embodiment, vertical growth occurs over the entire area).

It is effective to further perform etching after the formation of the pattern 210 shown in FIG. 2E, to eliminate nickel existing in a surface layer of the pattern 210.

After the formation of the pattern 210, a 200-Å-thick thermal oxidation film 211 is formed by a heat treatment at 800° C. in an oxygen atmosphere. The thermal oxidation film 211 becomes part of a gate insulating film of a thin-film transistor to be fabricated.

Embodiment 6

This embodiment is directed to a case where a thin-film transistor to be used in a pixel area of an active matrix liquid crystal display device or an active matrix EL display device is formed by utilizing the invention.

Figure 3A:
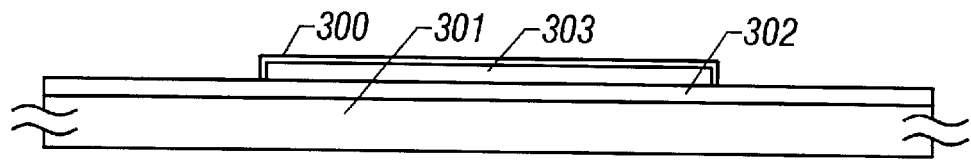
FIGS. 3A–3E show a manufacturing process of a thin-film transistor according to a sixth embodiment of the invention.

FIGS. 3A–3E show a manufacturing process according to this embodiment. First, a crystalline silicon film is formed on a substrate by the process of the first or fifth embodiment. Where a crystalline silicon film is formed by the process of the first embodiment, the state of FIG. 3A is obtained by etching the crystalline silicon film.

In the state of FIG. 3A, reference numerals 301–303 denote a substrate, an undercoat film, and an active layer consisting of a crystalline silicon film, respectively.

In the state of FIG. 3A, plasma processing has also been performed in a low-pressure, mixed atmosphere of oxygen and hydrogen. Plasma is generated by high-frequency discharge.

Organic substances existing on the exposed surface of the active layer 303 are removed. Stated more precisely, organic substances absorbed on the surface of the active layer 303 are oxidized by oxygen plasma, and the oxidized organic substances are reduced and vaporized by hydrogen plasma.

The removal of organic substances is effective in preventing fixed charges from existing on the surface of the active layer 303. Decreasing the number of fixed charges resulting from the existence of organic substances is very effective because they may impair the device operation or destabilize the device characteristics.

After the removal of organic substances, a 100-Å-thick thermal oxidation film 300 is formed through thermal oxidation at 850° C. in an oxygen atmosphere. The thermal oxidation film 300, which is superior in interface characteristics, becomes part of a gate insulating film. Thus, the state of FIG. 3A is obtained.

In this state, a 1,000-Å-thick silicon oxide film 304 is formed by plasma CVD. The silicon oxide film 304 constitutes a gate insulating film together with the thermal oxidation film 300.

It is effective to cause the silicon oxide film 304 to contain a halogen element. That is, by fixing nickel by the action of the halogen element, it can be prevented that the function, as an insulating film, of the gate insulating film is lowered being influenced by nickel (or some other metal element for accelerating crystallization of silicon) existing in the active layer 303.

Once the silicon oxide film 304 is formed, an aluminum film (not shown) to later serve as a gate electrode is formed by sputtering. Scandium is added to the aluminum film at 0.2 wt %, to suppress occurrence of hillocks and whiskers in a later step. Hillocks and whiskers are needle or prickle-like protrusions formed by abnormal growth of aluminum when it is heated.

After the formation of the aluminum film, a dense anodic oxide film (not shown) is formed on its surface in an electrolyte that is an ethylene glycol solution containing tartaric acid at 3%. The aluminum film is used as the anode and platinum is used as the cathode.

The thickness of the dense anodic oxide film is set at about 100 Å. This anodic oxide film has a role of improving the adhesiveness of a resist mask to be later formed on the aluminum film.

The thickness of the anodic oxide film can be controlled by the application voltage of the anodization.

Figure 3B:
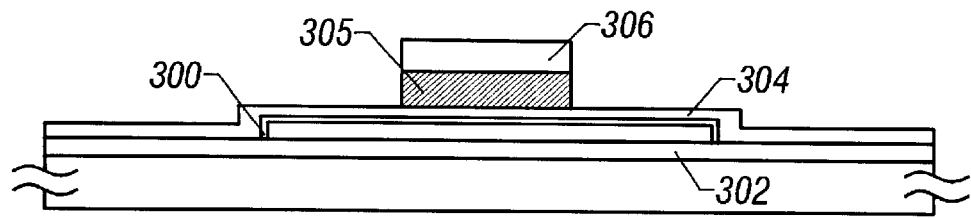

Next, a resist mask 306 is formed, and the aluminum film is patterned into a pattern 305. Thus, the state of FIG. 3B is obtained.

In this state, anodization is again performed in an electrolyte that is a 3% aqueous solution of oxalic acid with the aluminum pattern 305 used as the anode. As a result, porous anodic oxide films 308 are formed.

In this step, because of the existence of the highly adhesive resist mask 306 on the top face of the aluminum pattern 305, the anodic oxide films 308 are formed only on the side faces of the pattern 305.

The anodic oxide films 308 can grow to a thickness of several micrometers. In this embodiment, the thickness is set at 6,000Å. The thickness, i.e., the growth length can be controlled by the anodization time.

Next, after the resist mask 306 is removed, anodization is again performed in an electrolyte that is an ethylene glycol solution containing tartaric acid at 3% (the same electrolyte as used in the previous anodization), to form a dense anodic oxide film 309. The dense anodic oxide film 309 is formed as shown in FIG. 3C because the electrolyte enters the porous anodic oxide films 308.

The thickness of the dense anodic oxide film 309, which is controlled by the application voltage, is set at 1,000 Å.

Figure 3C:
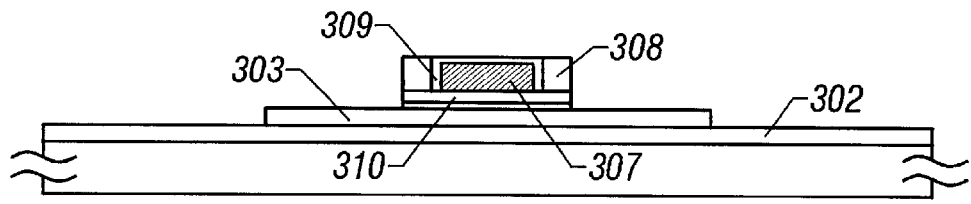
Figure 3D:
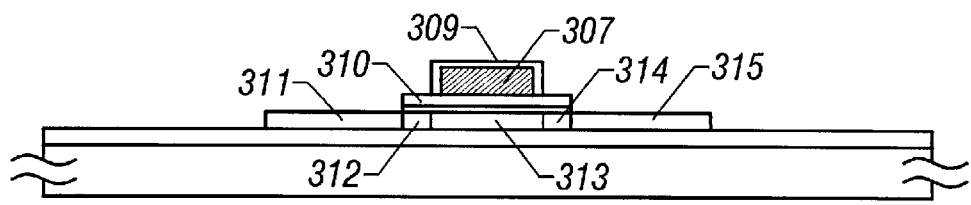

In this state, the exposed portions of the silicon oxide film 304 and the thermal oxidation film 300 are removed by dry etching (see FIG. 3C). Then, the porous anodic oxide films 308 are removed with a mixed acid of acetic acid, nitric acid, and phosphoric acid.

In this state, impurity ions are implanted. In this embodiment, P (phosphorus) ions are implanted by plasma doping to form an n-channel thin-film transistor.

In this step, heavily doped regions 311 and 315 and lightly doped regions 312 and 314 are formed, because the portions of the residual silicon oxide film 310 serve as a semi-transparent mask that interrupt part of incoming ions.

Laser light or strong light is the applied to activate the ion-implanted regions. Thus, a source region 311, a channel-forming region 313, a drain region 315, and low-concentration regions 312 and 314 are formed in a self-aligned manner. The region 314 is called a LDD (lightly doped drain) region (see FIG. 3D).

If the dense anodic oxide film 309 is made as thick as 2,000 Å, offset regions whose thickness corresponds to that of the dense anodic oxide film 309 can be formed outside the channel-forming region 313.

Offset regions are formed in this embodiment though they are not shown in the drawings. However, the offset regions in the embodiment are short, they have only little contribution.

Next, a silicon oxide film, a silicon nitride film, or a laminate film thereof is formed as an interlayer insulating film 316. Alternatively, the interlayer insulating film 316 may be a combination of a silicon oxide film or a silicon nitride film and a resin film formed thereon.

Figure 3E:
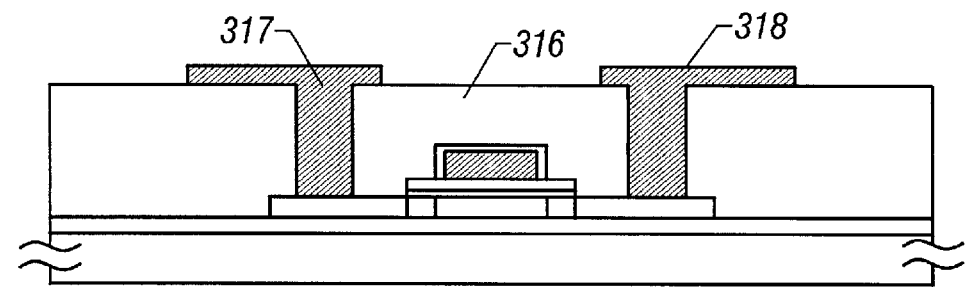

Then, after contact holes are formed, a source electrode 317 and a drain electrode 318 are formed. Thus, a thin-film transistor is completed as shown in FIG. 3E.

Embodiment 7

This embodiment is directed to a case where a thin-film transistor is formed by a different process than shown in FIGS. 3A–3E.

FIGS. 4A–4E show a manufacturing process according to this embodiment. First, a crystalline silicon film is formed on a substrate by the process of the first or second embodiment. The crystalline silicon film is then patterned to obtain the state of FIG. 4A.

In this state, plasma processing has also been performed in a low-pressure, mixed atmosphere of oxygen and hydrogen.

Figure 4A:
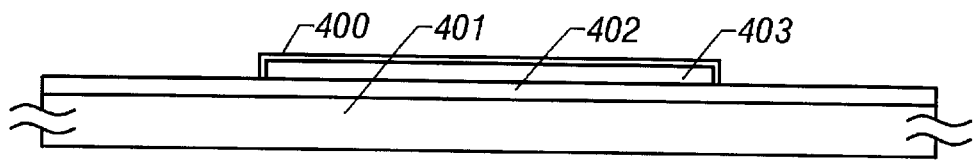
FIGS. 4A–4E show a manufacturing process of a thin-film transistor according to a seventh embodiment of the invention.

In FIG. 4A, reference numerals 410–403 denote a substrate, an undercoat film, and an active layer constituted of a crystalline silicon film. Numeral 400 denotes a thermal oxidation film that is formed after removal of a thermal oxidation film for gettering.

Once the state of FIG. 4A is obtained, a 1,000-Å-thick silicon oxide film 404 is formed by plasma CVD. The silicon oxide film 404 constitutes a gate insulating film together with the thermal oxidation film 400.

Once the silicon oxide film 404 is formed, an aluminum film (not shown) to later serve as a gate electrode is formed by sputtering. Scandium is added to the aluminum film at 0.2 wt %.

After the formation of the aluminum film, a 100-Å-thick dense anodic oxide film (not shown) is formed thereon. This anodic oxide film has a role of improving the adhesiveness with a later formed resist mask.

Next, a resist mask 405 is formed, and the aluminum film is patterned into a pattern 406.

In this state, anodization is again performed in an electrolyte that is a 3% aqueous solution of oxalic acid with the aluminum pattern 406 used as the anode. As a result, porous anodic oxide films 407 are formed.

Figure 4B:
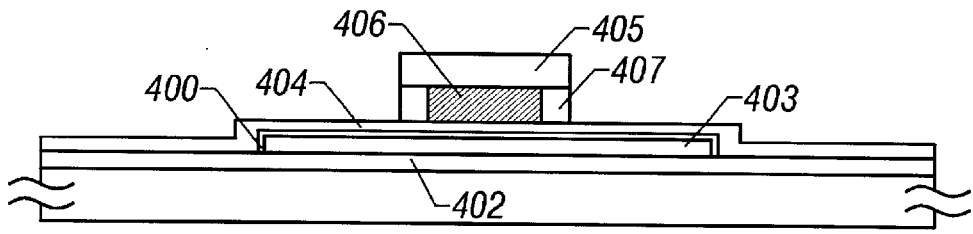

In this step, because of the existence of the highly adhesive resist mask 405 on the top face of the aluminum pattern 406, the anodic oxide films 407 are formed only on the side faces of the pattern 406 (see FIG. 4B).

The anodic oxide films 407 can grow to a thickness of several micrometers. In this embodiment, the thickness is set at 6,000Å. The thickness, i.e., the growth length can be controlled by the anodization time.

Figure 4C:
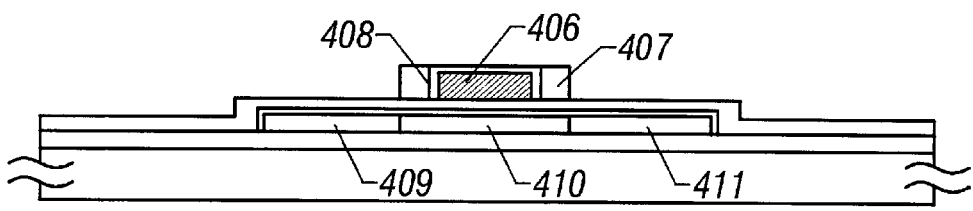

Next, after the resist mask 405 is removed, anodization is again performed in an electrolyte that is an ethylene glycol solution containing tartaric acid at 3% (the same electrolyte as used in the previous anodization), to form a dense anodic oxide film 408. The dense anodic oxide film 407 is formed as shown in FIG. 4C because the electrolyte enters the porous anodic oxide films 407.

Then, first impurity ion implantation is performed. This step may be performed after removal of the resist mask 405.

As a result of this impurity ion implantation, a source region 409 and a drain region 411 are formed. No impurity ions are implanted into a region 410 (see FIG. 4C).

Figure 4D:
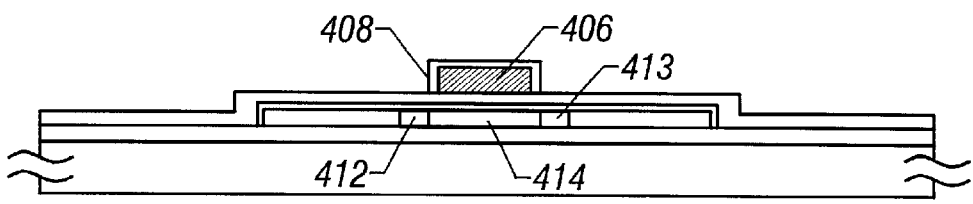

Next, the porous anodic oxide films 407 are removed by using a mixed acid of acetic acid, nitric acid, and phosphoric acid. Thus, the state of FIG. 4D is obtained.

In this state, impurity ions are again implanted under conditions for lighter doping than in the first impurity ion implantation. In this step, lightly doped regions 412 and 413 are formed. A region 414 becomes a channel-forming region (see FIG. 4D).

Laser light or strong light is the applied to activate the ion-implanted regions. Thus, a source region 409, a channel-forming region 414, a drain region 411, and low-concentration regions 412 and 413 are formed in a self-aligned manner. The region 413 is called an LDD (lightly doped drain) region (see FIG. 4D).

Next, a silicon oxide film, a silicon nitride film, or a laminate film thereof is formed as an interlayer insulating film 415. Alternatively, the interlayer insulating film 415 may be a combination of a silicon oxide film or a silicon nitride film and a resin film formed thereon.

Figure 4E:
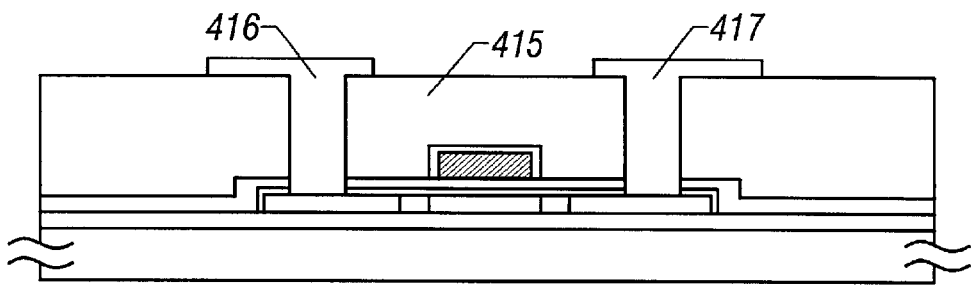

Then, after contact holes are formed, a source electrode 416 and a drain electrode 417 are formed. Thus, a thin-film transistor is completed as shown in FIG. 4E.

Embodiment 8

This embodiment is directed to a case of forming an n-channel thin-film transistor and a p-channel thin-film transistor in complementary form. For example, this embodiment can be applied to various thin-film integrated circuits formed on an insulating surface. The embodiment can also be applied to a peripheral driver circuit of an active matrix liquid crystal display device.

Figure 5A:
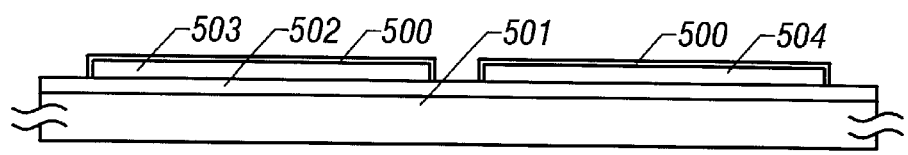
FIGS. 5A–5F show a manufacturing process of a thin-film transistor according to an eighth embodiment of the invention.

First, as shown in FIG. 5A, a silicon oxide film as an undercoat film 502 is formed on a substrate 501. The substrate 501 contains OH group at 300–700 ppm and chlorine at 50–150 ppm.

Next, an amorphous silicon film is formed by plasma CVD or low-pressure thermal CVD, and then converted into a crystalline silicon film by the method of the first embodiment.

Subsequently, plasma processing is performed in a mixed atmosphere of oxygen and hydrogen. A resulting crystalline silicon film is patterned into active layers 503 and 504. Thus, the state of FIG. 5A is obtained.

In this state, a heat treatment is performed at 750° C. for 10 hours in a nitrogen atmosphere containing HCl at 3%, to suppress influences of carriers moving along the side faces of the active layers 503 and 504.

If trap states exist on the side faces of the active layers 503 and 504 due to the existence of a metal element, the off-current characteristic is deteriorated. Therefore, it is effective to decrease the density of such trap states by the above treatment.

Next, thermal oxidation films 500 and silicon oxynitride films 505 are formed which together constitute a gate insulating film. If a quartz substrate is used, it is desirable that a gate insulating film be constituted of only a thermal oxidation film that is formed by the above-described thermal oxidation method.

Then, a 4,000-Å-thick aluminum film (not shown) to later constitute a gate electrode is formed. Instead of aluminum, some other metal capable of being anodized, such as tantalum, may be used.

After the formation of the aluminum film, a very thin, dense anodic oxide film is formed on its surface by the above-described method.

Next, after a resist film (not shown) is formed on the aluminum film, the aluminum film is patterned. Anodization is then performed by using a resulting aluminum pattern as the anode, to form porous anodic oxide films 508 and 509, which have a thickness of 5,000 Å, for instance.

Figure 5B:
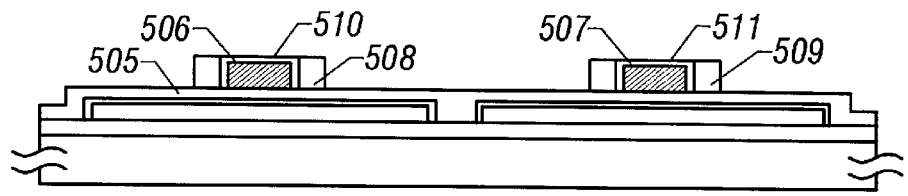

Subsequently, anodization is again performed under conditions suitable for formation of a dense anodic oxide film, to form dense anodic oxide films 510 and 511. Their thickness is set at 800 Å. Thus, the state of FIG. 5B is obtained.

Figure 5C:
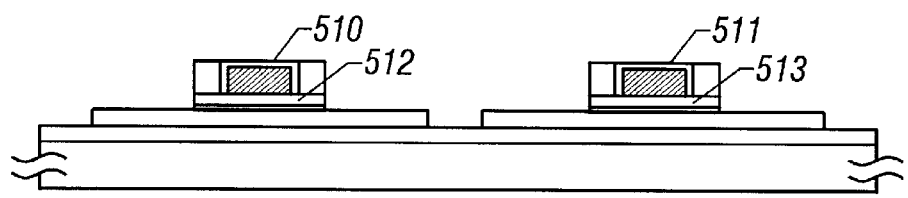

The exposed portions of the silicon oxide films 505 and the thermal oxidation films 500 are removed by dry etching, to obtain the state of FIG. 5C.

In this state, the porous anodic oxide films 508 and 509 are removed by using a mixed acid of acetic acid, nitric acid, and phosphoric acid.

Next, while resist masks are formed alternately, P ions are implanted into a left-hand thin-film transistor and B ions are implanted into a right-hand thin-film transistor. As a result, heavily doped, n-type source and drain regions 514 and 517 are formed in a self-aligned manner.

At the same time, a weak n-type region 515 doped with P ions lightly as well as a channel-forming region 516 are formed. The formation of the weak n-type region 515 is due to the existence of the residual gate insulating film 512. That is, part of incoming P ions are interrupted by the gate insulating film 512.

Figure 5D:
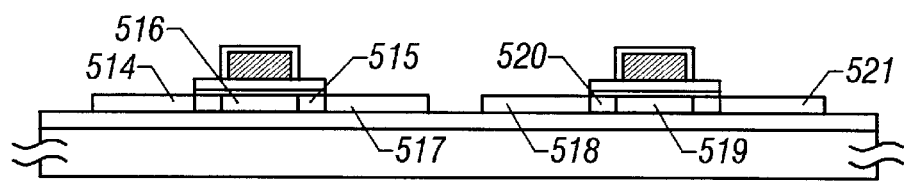

According to the same principle, strong p-type source and drain regions 521 and 518 are formed in a self-aligned manner. At the same time, a low-concentration impurity region 520 and a channel-forming region 519 are formed. Thus, the state of FIG. 5D is obtained.

Where the dense anodic oxide films 510 and 511 are thick, for instance, 2,000-Å thick, offset regions can be formed whose thickness corresponds to that of the dense anodic oxide films 510 and 511 can be formed in contact with the channel-forming region 516 and 519. In this embodiment, offset regions can be disregarded because the dense anodic oxide films 510 and 511 are as thin as less than 1,000 Å.

Then, laser light or strong light are applied to anneal the ion-implanted regions.

Next, a silicon nitride film 522 and a silicon oxide film 523 as interlayer insulating films are formed at a thickness of 1,000 Å. The silicon oxide film 523 may be omitted.

Figure 5E:
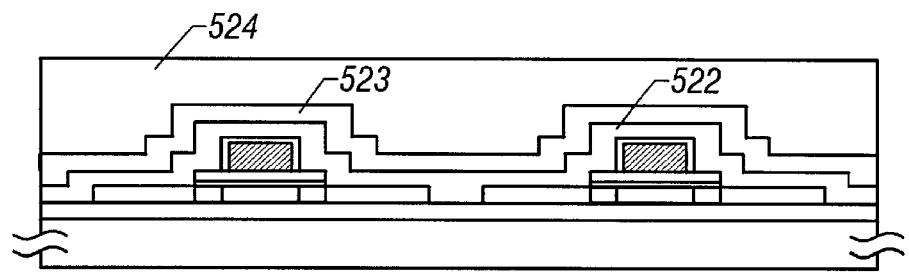
Figure 5F:
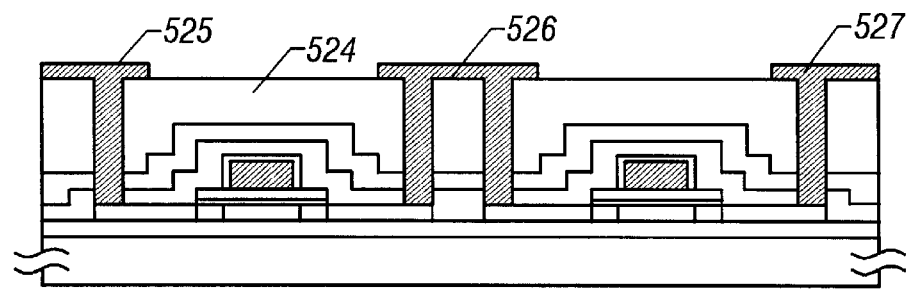

As shown in FIG. 5E, the thin-film transistors are covered with the silicon nitride film 522. Since in general a silicon nitride film is dense and exhibits superior interface characteristics, this structure contributes to improvement in the reliability of the thin-film transistors.

Further, a 1-$\mu$m-thick interlayer insulating film 524 is formed by spin coating by using a resin material (see FIG. 5E).

Then, after contact holes are formed, a source electrode 525 and a drain electrode 526 for the left-hand, n-channel thin-film transistor are formed and, at the same time, a source electrode 527 and a drain electrode 526 for the right-hand, p-channel thin-film transistor are formed. The drain electrodes 526 are connected to each other.

Thus, a CMOS thin-film transistor circuit is obtained.

In this embodiment, the thin-film transistors are covered with the nitride film and further with the resin film. In this structure, mobile ions and water are hard to penetrate into the thinfilm transistors, and hence they are highly durable. Further, in the case of multilayer interconnection, this structure prevents formation of capacitance between the thin-film transistors and interconnections.

Embodiment 9

This embodiment is directed to a case where single crystal region or a region that can substantially be regarded as a single crystal is formed by applying laser light to a crystalline silicon film formed according to the first or second embodiment.

First, a crystalline silicon film is formed by utilizing the action of nickel as described in the first embodiment. The crystallinity is improved by irradiating the crystalline silicon film with excimer laser light (for instance, laser light emitted from a KrF excimer laser). During this step, a heat treatment is also performed at not lower than 450° C. and the laser light irradiation conditions are optimized, whereby a single crystal region or a region that can substantially be regarded as a single crystal is formed.

A film whose crystallinity has been improved greatly by the above method has an electron spin density, as measured by ESR, of less than $3 \times 10^{17}$ cm$^{-3}$ and a nickel concentration of less than $3 \times 10^{17}$ cm$^{-3}$ as the minimum of values measured by SIMS (secondary ion mass spectrometry). Further, such a film has a region that can be regarded as a single crystal.

This region having substantially no grain boundaries can provide superior electrical characteristics equivalent to those of a single crystals silicon wafer.

The region that can be regarded as a single crystal contains hydrogen at 5 atomic % to $1 \times 10^{15}$ cm$^{-3}$. This value was obtained by a SIMS measurement.

A thin-film transistor formed by using a single crystal region or a region that can be regarded as a single crystal as mentioned above is equivalent to a MOS transistor formed on a single crystal wafer.

Embodiment 10

This embodiment is directed to a case where nickel is directly applied to the surface of an undercoat film in the process of the first embodiment. In this case, nickel is held adjacent to the bottom surface of an amorphous silicon film.

In this embodiment, nickel is directly applied after formation of an undercoat film to establish a state that nickel (i.e., a metal element) is held adjacent to the surface of the undercoat film. Nickel may be applied by using a solution or by some other method such as sputtering, CVD, or an absorption method.

Embodiment 11

This embodiment explains, based on experimental data, the effects of gettering nickel by the action of chlorine from a crystalline silicon film that has been crystallized by the action of nickel.

Figure 6:
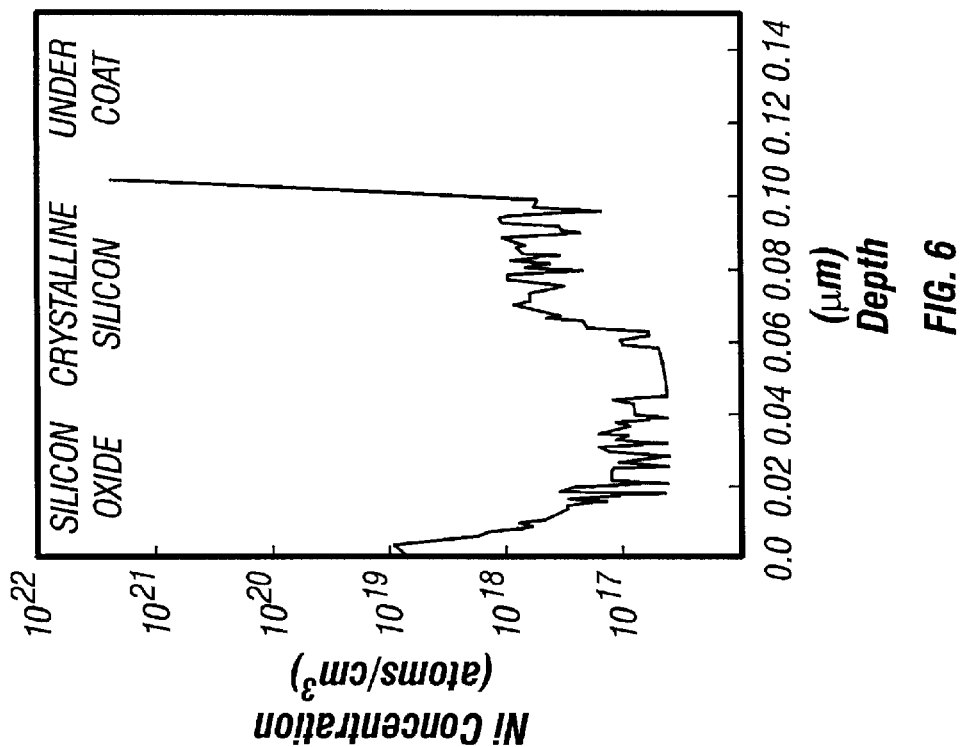

FIG. 6 shows an SIMS measurement result of a nickel concentration profile in a cross-section of a crystalline silicon film formed by using nickel.

Measurement data of a portion in the vicinity of the surface are not meaningful because they are influenced by surface asperities and absorbed substances. For the same reasons, data of portions in the vicinity of the boundaries include certain errors somewhat.

A brief description is made of a method for forming the sample from which the above measurement data were obtained. First, a 4,000-Å-thick silicon oxide film as an undercoat film is formed on a quartz substrate. A 500-Å-thick amorphous silicon film is formed thereon by low-pressure thermal CVD.

Then, nickel is introduced to the amorphous silicon film by a method using a nickel acetate salt solution as described in the first embodiment. A crystalline silicon film is obtained by crystallizing the amorphous silicon film by performing a heat treatment at 650° C. for 4 hours.

Further, a 500-Å-thick thermal oxidation film is formed by performing a heat treatment at 950° C. in an oxygen atmosphere.

As seen from FIG. 6, nickel exists in the crystalline silicon (poly-Si) film at a higher concentration than in the other region. High nickel concentration in the vicinity of the surface of the thermal oxidation film is not meaningful because it is a measurement error due to influences of the surface states.

Figure 7:
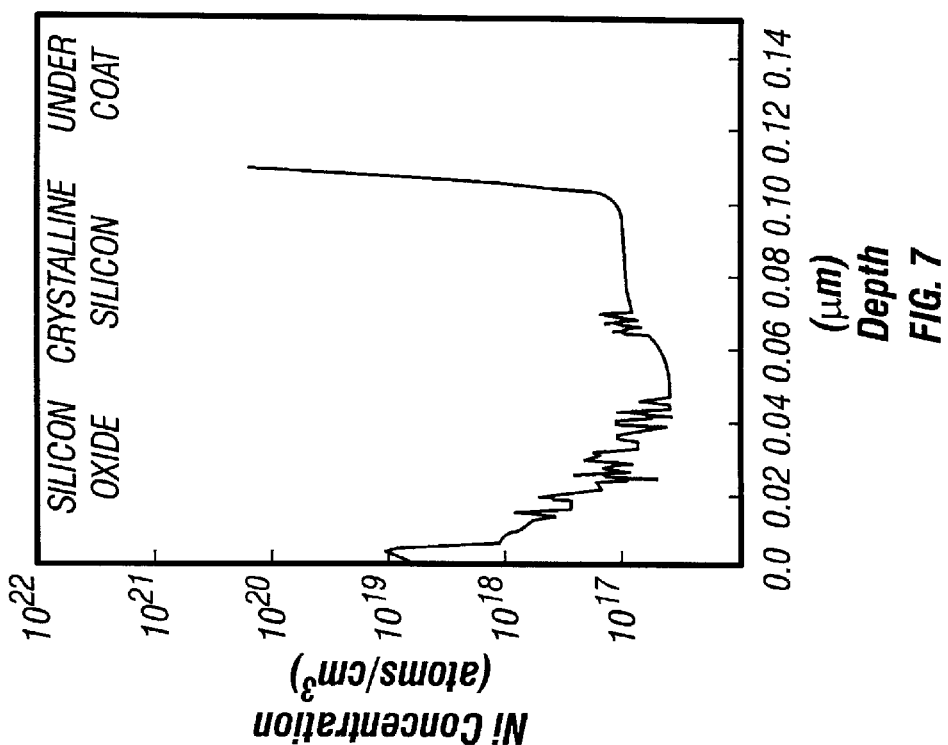
FIGS. 6 and 7 show nickel concentration profiles (eleventh embodiment)

FIG. 7 shows measurement data of a sample in which a thermal oxidation film was formed in an oxygen atmosphere containing HCl at 3%.

In FIG. 7, the nickel concentration in the crystalline silicon (poly-Si) film is lower than in the case of FIG. 6. Instead, the nickel concentration in the thermal oxidation film is relatively increased. This means that nickel was moved to (i.e., gettered into) the thermal oxidation film.

The only difference between the samples of FIGS. 6 and 7 is that in the sample of FIG. 7 the thermal oxidation film was formed in an atmosphere containing HCl. Therefore, it is concluded that the above gettering effect is due to HCl. Since no gettering effect of hydrogen has been found yet, it is more correct to conclude that the gettering effect as indicated by the difference between FIGS. 6 and 7 is caused by the action of chlorine.

It is understood that a crystalline silicon film having a lowered nickel concentration can be obtained by removing the thermal oxidation film into which nickel has been gettered.

Figure 8:
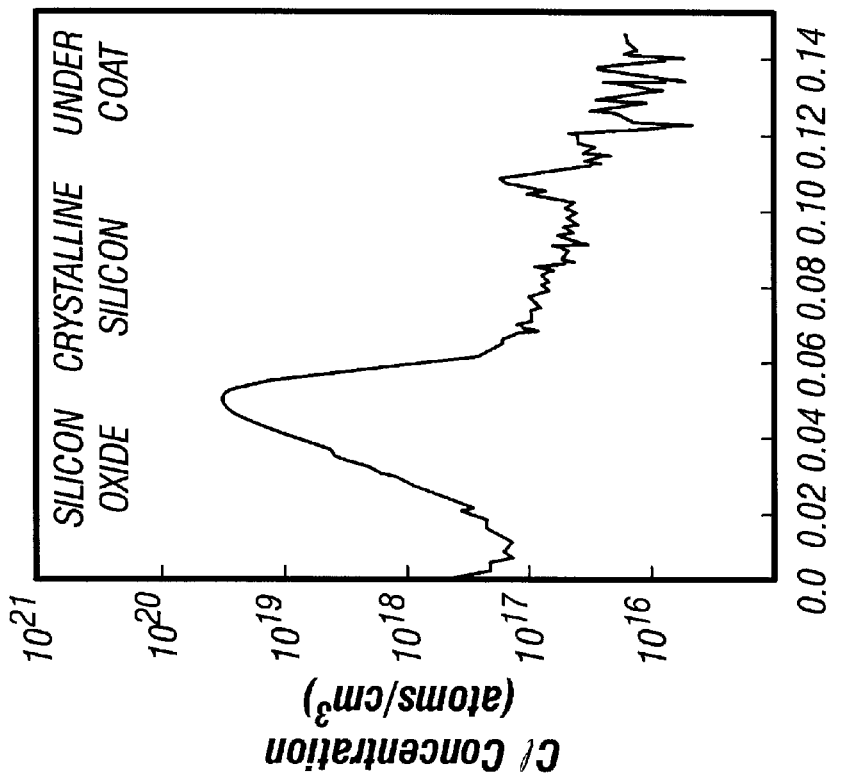
FIG. 8 shows a chlorine concentration profile (eleventh embodiment)

FIG. 8 shows a chlorine concentration profile of a sample that was formed under the same conditions as the sample from which the data of FIG. 7 were obtained. As seen from FIG. 8, chlorine is concentrated in the vicinity of the interface between the crystalline silicon film and the thermal oxidation film.

Embodiment 12

This embodiment is directed to a case where an amorphous silicon film formed by plasma CVD is used as a starting film of a crystalline silicon film in contrast to the fact that in the eleventh embodiment the starting film is an amorphous silicon film formed by low-pressure thermal CVD. Since an amorphous silicon film formed by plasma CVD has different film quality than that formed by low-pressure thermal CVD, they are different in gettering action too as described below.

Figure 9:
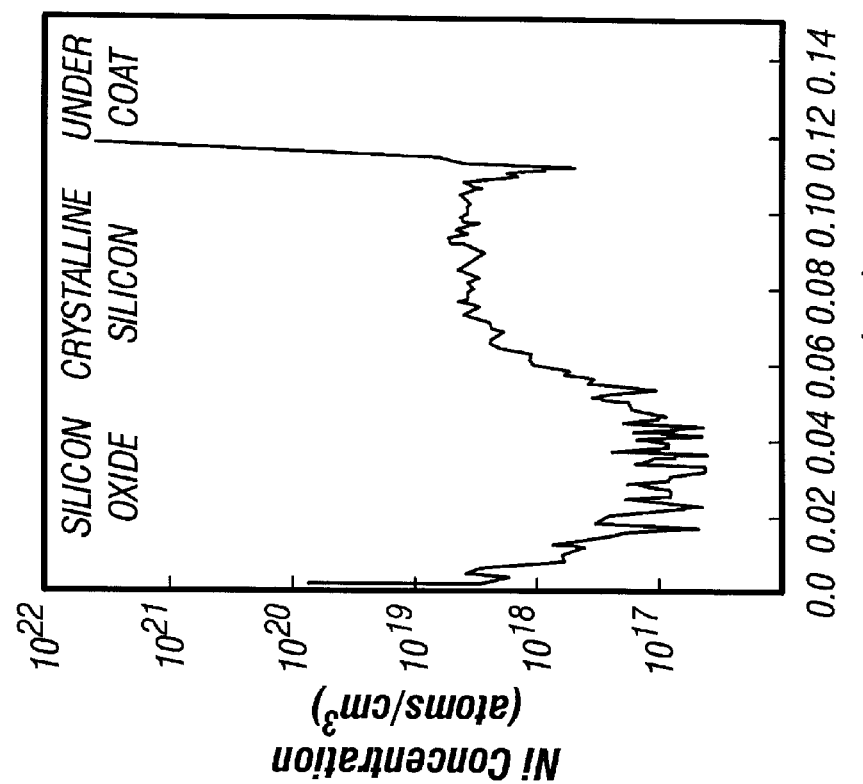
FIGS. 9 and 10 show nickel concentration profiles (twelfth embodiment)

FIG. 9 is measurement data for comparison which were obtained from a sample in which a thermal oxidation film was formed at 950° C. in an oxygen atmosphere. As seen from FIG. 9, nickel exists at a high concentration in a crystalline silicon (poly-Si) film.

In spite of the fact that nickel was introduced under the same conditions, the nickel concentration in the crystalline silicon film in FIG. 9 is higher than in FIG. 6. This is considered due to the fact that the amorphous silicon film formed by plasma CVD is sparser and contain more defects and hence nickel diffuses into the film more easily.

The above difference in nickel concentration may be explained as follows from another point of view. Before applying a nickel acetate solution, a very thin oxide film is formed on the surface of an amorphous silicon film by UV oxidation. There is a possibility that the thickness of this oxide film is different between the two cases due to the difference in the film quality of the underlying amorphous silicon film. It may be concluded that the difference in film thickness caused the difference in nickel concentration between FIGS. 6 and 9, because the difference in film thickness should cause a difference in the amount of nickel that diffuses into the silicon film.

Figure 10:
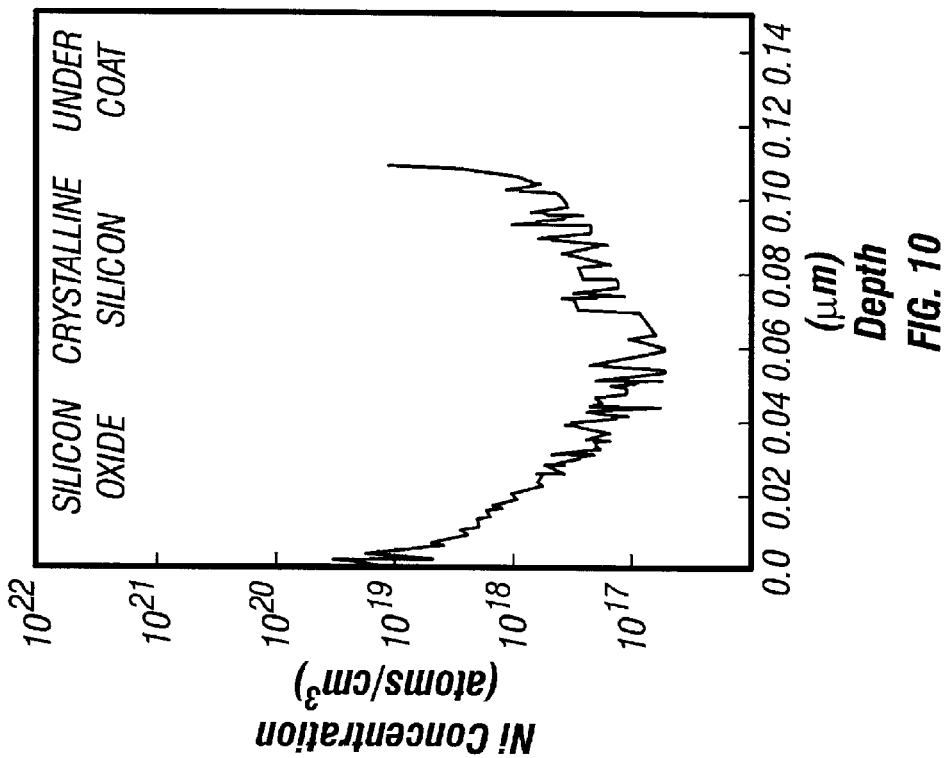

FIG. 10 is data obtained from a sample in which a thermal oxidation film was formed in an atmosphere containing HCl at 10% with respect to oxygen. As seen from FIG. 10, the nickel concentration in the crystalline silicon (poly-Si) film is lower than in the data of FIG. 9. Instead, the nickel concentration in the thermal oxidation film is relatively increased.

This means that nickel was gettered into the thermal oxidation film due to the action of chlorine. As is understood from the above, by forming a thermal oxidation film on a silicon film in an atmosphere containing chlorine, nickel can efficiently be gettered from the silicon film into the thermal oxidation film.

Therefore, a crystalline silicon film having a lowered nickel concentration can be obtained by removing the thermal oxidation film into which nickel has been gettered.

Figure 11:
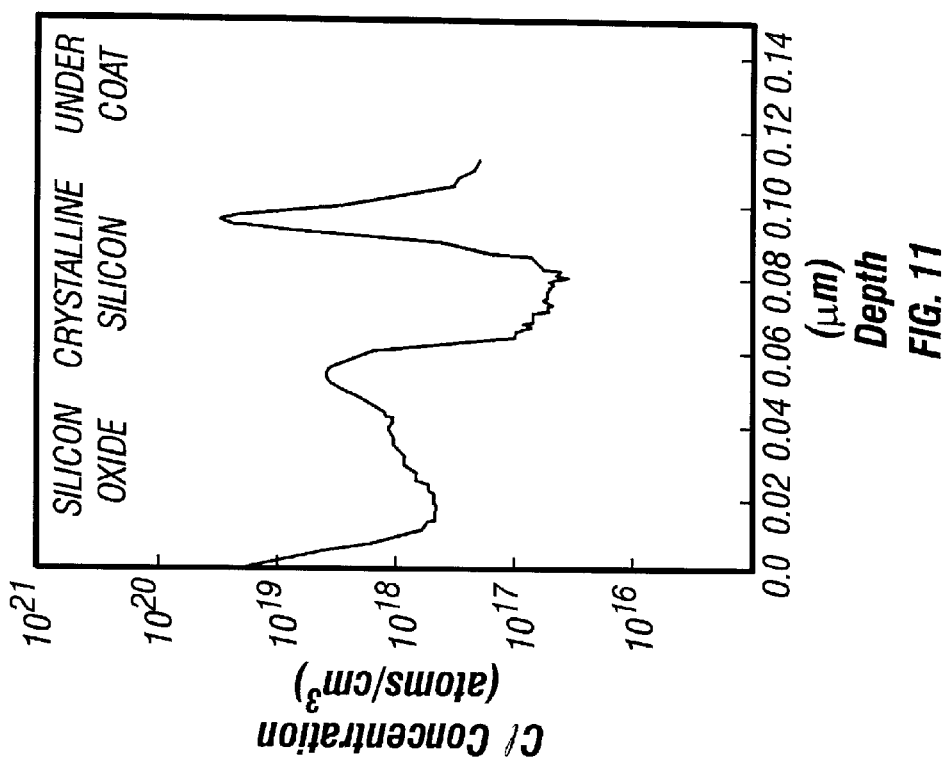
FIG. 11 shows a chlorine concentration profile (twelfth embodiment).

FIG. 11 shows a chlorine concentration profile of a sample that was formed under the same conditions as the sample from which the data of FIG. 10 were obtained. As seen from FIG. 11, chlorine exists at high concentrations in the vicinity of the boundaries between the undercoat film and the crystalline silicon film and between the crystalline silicon film and the thermal oxidation film.

FIG. 11 should be compared with FIG. 8. It is considered that the chlorine concentration profile of FIG. 11 is due to the fact that the amorphous silicon film as the starting film which was formed by plasma CVD is not dense.

It is considered that the fact that the nickel concentration is high also in the vicinity of the interface between the undercoat film and the crystalline silicon film results from nickel gettering toward the undercoat film due to the action of chlorine existing in the vicinity of the interface with the undercoat film (or in the undercoat film).

This phenomenon would also occur when a halogen element is added to an undercoat film.

As described above, the invention can reduce the concentration of a metal element in a crystalline silicon film obtained by utilizing the metal element. As a result, a thin-film semiconductor device having superior electrical characteristics can be obtained.

What is claimed is:

1. A method of manufacturing a semiconductor device comprising:

preparing a substrate containing OH group at 50–2000 ppm and chlorine at 10–1000 ppm and having a strain point of 650–1000° C.;

depositing a semiconductor film comprising amorphous silicon over said substrate by LPCVD wherein each concentration of oxygen, carbon and nitrogen contained in said semiconductor film is not higher than $2 \times 10^{19}$ atoms/cm$^3$;

crystallizing said semiconductor film by first heating; and second heating the crystallized semiconductor film in an oxidizing atmosphere to oxidize a surface of said semiconductor film.

2. A method according to claim 1 wherein said semiconductor film as deposited on said insulating surface has a thickness in a range from 800 Å to 5000 Å.

3. A method according to claim 1 wherein said second heating is conducted at a higher temperature than said first heating.

4. A method of manufacturing a semiconductor device comprising:

preparing a substrate containing OH group at 50–2000 ppm and chlorine at 10–1000 ppm and having a strain point of 650–1000° C.;

depositing a semiconductor film comprising amorphous silicon over said substrate by LPCVD wherein each concentration of oxygen, carbon and nitrogen contained in said semiconductor film is not higher than $2 \times 10^{19}$ atoms/cm$^3$;

crystallizing said semiconductor film by first heating;

irradiating said semiconductor film with a laser light after said first heating; and second heating the crystallized semiconductor film in an oxidizing atmosphere to oxidize a surface of said semiconductor film.

5. A method according to claim 4 wherein said semiconductor film as deposited on said insulating surface has a thickness in a range from 200 Å to 2000 Å.

6. A method according to claim 4 wherein said second heating is conducted at a higher temperature than said first heating.

7. A method according to claim 4 wherein said laser is an exciter laser.

8. A method of manufacturing a semiconductor device comprising:
   preparing a substrate containing OH group at 50–2000 ppm and chlorine at 10–1000 ppm and having a strain point of 650–1000° C.;
   depositing a semiconductor film comprising amorphous silicon over said substrate by LPCVD wherein each concentration of oxygen, carbon and nitrogen contained in said semiconductor film is not higher than $2\times10^{19}$ atoms/cm$^3$;
   crystallizing said semiconductor film by first heating;
   irradiating said semiconductor film with a laser light after said first heating; and
   second heating the crystallized semiconductor film at a higher temperature than said first heating.

9. A method according to claim 8 wherein said semiconductor film as deposited on said insulating surface has a thickness in a range from 200 Å to 2000 Å.

10. A method according to claim 8 wherein said laser is an excimer laser.

11. A method of manufacturing a semiconductor device comprising:
   preparing a substrate containing OH group at 50–2000 ppm and chlorine at 10–1000 ppm and having a strain point of 650–1000° C.;
   depositing a semiconductor film comprising amorphous silicon over said substrate by LPCVD wherein each concentration of oxygen, carbon and nitrogen contained in said semiconductor film is not higher than $2\times10^{19}$ atoms/cm$^3$;
   crystallizing said semiconductor film by first heating;
   irradiating said semiconductor film with a laser light after said first heating; and
   second heating the crystallized semiconductor film,
   wherein the semiconductor film has an electron spin density $3\times10^{17}$ or lower.

12. A method according to claim 11 wherein the semiconductor film is made single crystal by the irradiation of said laser light.

13. A method according to claim 11 wherein said laser is an excimer laser.

14. A method of manufacturing a semiconductor device comprising:
   preparing a substrate containing OH group at 50–2000 ppm and chlorine at 10–1000 ppm and having a strain point of 650–1000° C.;
   depositing a semiconductor film comprising amorphous silicon over said substrate by LPCVD;
   introducing a crystallization promoting material into said semiconductor film;
   crystallizing said semiconductor film by first heating; and
   second heating the crystallized semiconductor film in an oxidizing atmosphere to oxidize a surface of said semiconductor film.

15. A method according to claim 1, wherein said semiconductor device is an EL display.

16. A method according to claim 4, wherein said semiconductor device is an EL display.

17. A method according to claim 8, wherein said semiconductor device is an EL display.

18. A method according to claim 11, wherein said semiconductor device is an EL display.

19. A method according to claim 14, wherein said semiconductor device is an EL display.

* * * * *